United States Patent
Park et al.

(10) Patent No.: US 9,887,252 B2
(45) Date of Patent: Feb. 6, 2018

(54) TRANSPARENT DISPLAY APPARATUS

(71) Applicant: SAMSUNG DISPLAY CO., LTD., Yongin-si, Gyeonggi-do (KR)

(72) Inventors: Gyungsoon Park, Yongin-si (KR); Ilgon Kim, Yongin-si (KR); Minjae Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/133,302

(22) Filed: Apr. 20, 2016

(65) Prior Publication Data
US 2017/0110521 A1    Apr. 20, 2017

(30) Foreign Application Priority Data
Oct. 19, 2015  (KR) .......................... 10-2015-0145429

(51) Int. Cl.
*H01L 27/32* (2006.01)
*H01L 51/52* (2006.01)

(52) U.S. Cl.
CPC ........ *H01L 27/326* (2013.01); *H01L 27/3258* (2013.01); *H01L 51/5209* (2013.01); *H01L 51/5225* (2013.01); *H01L 51/5237* (2013.01)

(58) Field of Classification Search
CPC ............. H01L 27/3276; H01L 27/3296; H01L 27/3297
See application file for complete search history.

(56) References Cited

U.S. PATENT DOCUMENTS

| | | | |
|---|---|---|---|
| 2003/0094615 A1* | 5/2003 | Yamazaki | H01L 27/12 257/72 |
| 2004/0135941 A1* | 7/2004 | Nam | G02F 1/133512 349/110 |
| 2006/0250083 A1 | 11/2006 | Oh et al. | |
| 2008/0224600 A1* | 9/2008 | Im | H01L 27/3276 313/504 |
| 2011/0147770 A1* | 6/2011 | Hwang | H01L 27/326 257/89 |
| 2011/0175097 A1* | 7/2011 | Song | H01L 27/326 257/59 |
| 2011/0204369 A1* | 8/2011 | Ha | H01L 51/5228 257/59 |
| 2011/0303930 A1 | 12/2011 | Bang et al. | |
| 2013/0127335 A1* | 5/2013 | Chang | H05B 33/04 313/512 |

(Continued)

FOREIGN PATENT DOCUMENTS

| | | |
|---|---|---|
| KR | 10-2006-0059745 | 6/2006 |
| KR | 10-2011-0135734 | 12/2011 |
| KR | 10-2014-0002392 | 1/2014 |

*Primary Examiner* — Bryan Junge
(74) *Attorney, Agent, or Firm* — F. Chau & Associates, LLC

(57) ABSTRACT

A display apparatus includes a display area and a non-display area around the display area. A substrate includes a plurality of pixels. Each pixel includes a first area through which light is emitted and a second area through which external light is transmitted. The plurality of pixels is arranged in a matrix in the display area. The substrate includes a transmission area, through which external light is transmitted, in the non-display area. An encapsulation thin film seals the substrate.

17 Claims, 15 Drawing Sheets

(56) References Cited

U.S. PATENT DOCUMENTS

| | | | | |
|---|---|---|---|---|
| 2014/0049453 A1* | 2/2014 | Lee | ............ | G09G 3/20 |
| | | | | 345/55 |
| 2014/0183479 A1* | 7/2014 | Park | ............ | H01L 51/56 |
| | | | | 257/40 |
| 2015/0362776 A1* | 12/2015 | Jikumaru | ............ | H01L 27/124 |
| | | | | 349/12 |

* cited by examiner

TRANSPARENT DISPLAY APPARATUS

CROSS-REFERENCE TO RELATED APPLICATION

This application claims priority under 35 U.S.C. § 119 to Korean Patent Application No. 10-2015-0145429, filed on Oct. 19, 2015, in the Korean Intellectual Property Office, the disclosure of which is incorporated by reference herein in its entirety.

1. TECHNICAL FIELD

Exemplary embodiments of the present invention relate to a display apparatus, and more particularly to a transparent display apparatus.

2. DISCUSSION OF RELATED ART

A display apparatus may be a transparent display apparatus. The transparent display apparatus may include a transparent thin-film transistor or a transparent display device that is disposed in the display apparatus.

An organic light-emitting display apparatus may be a self-emissive display apparatus that might not need a separate light source, and thus the organic light-emitting display apparatus may operate at a relatively low voltage. The organic light-emitting display apparatus may be relatively light and thin, and may have relatively wide viewing angles, a relatively high contrast ratio, and relatively fast response rates.

SUMMARY

One or more exemplary embodiments of the present invention include a transparent display apparatus in which a non-display area is transparent.

According to one or more exemplary embodiments of the present invention, a display apparatus includes a substrate including a display area and a non-display area around the display area. The substrate includes a plurality of pixels. Each pixel includes a first area from which light is emitted and a second area through which external light is transmitted. The plurality of pixels is arranged in a matrix in the display area. The substrate includes a transmission area, through which external light is transmitted, in the non-display area. An encapsulation thin film seals the substrate.

The substrate may include a power supply line having an opening in a position corresponding to the transmission area of the non-display area.

The substrate may include a driver including a third area in which a driving circuit supplying a signal to the pixels is disposed and a fourth area around the third area which corresponds to the transmission area, in the non-display area.

The display apparatus may include an insulating layer covering pixel circuits of the display area and extending to the non-display area. A first conductive layer may include a first electrode provided for each sub-pixel on the insulating layer of the display area and a connection electrode insulated from the first electrode on the insulating layer of the non-display area and contacting a portion of an upper surface of the power supply line. A second conductive layer may face the first electrode. An emission layer may be disposed between the first electrode and the second conductive layer in the display area. The second conductive layer may be in contact with an upper surface of the first conductive layer in the non-display area. In the non-display area, the first conductive layer and the second conductive layer may have an opening in a position corresponding to the transparent area.

A size of the transmission area of the non-display area may be substantially equal to that of the second area of each of the plurality of pixels.

A size of the transmission area of the non-display area may be different from that of the second area of each of the plurality of pixels.

A size of the transmission area of the non-display area may be smaller than that of the second area of each of the plurality of pixels. The size of the transmission area of the non-display area may gradually decrease toward an edge of the substrate.

A size of the transmission area of the non-display area may be larger than that of the second area of each of the plurality of pixels. The size of the transmission area of the non-display area may gradually increase toward an edge of the substrate.

According to one or more exemplary embodiments of the present invention, a display apparatus includes a substrate including a display area and a non-display area around the display area and a plurality of pixels arranged in a matrix in the display area of the substrate. Each of the plurality of pixels includes a first area through which light is emitted and a second area through which external light is transmitted. A power supply line may be disposed in the non-display of the substrate. The power supply line may include an opening through which the external light is transmitted.

The display apparatus may include an insulating layer covering pixel circuits of the display area and extending to the non-display area. A first conductive layer may be on the insulating layer of the non-display area and may contact a portion of an upper surface of the power supply line. A second conductive layer may contact an upper surface of the first conductive layer in the non-display area. The first conductive layer and the second conductive layer may have an opening in a position corresponding to the opening of the power supply line.

Each of the plurality of pixels may include a plurality of sub-pixels. A first area of each of the plurality of sub-pixels may include a first electrode on the insulating layer of the display area and a second electrode that faces the first electrode. The second electrode may include a portion of the second conductive layer in the display area. An emission layer may be between the first electrode and the second electrode.

The first electrode may include a same material as the first conductive layer.

A size of the opening of the power supply line may be substantially equal to that of the second area of each of the plurality of pixels.

A size of the opening of the power supply line may be different from that of the second area of each of the plurality of pixels.

A size of the opening of the power supply line may be smaller than that of the second area of each of the plurality of pixels. The size of the opening may gradually decrease toward an edge of the substrate.

A size of the opening of the power supply line may be larger than that of the second area of each of the plurality of pixels. The size of the opening may gradually increase toward an edge of the substrate.

The non-display area may include a driver between the power supply line and the display area. The driver may include a third area in which a driving circuit for supplying a signal to the pixels is disposed and a fourth area around the third area through which the external light is transmitted.

The display apparatus may include an insulating layer covering pixel circuits of the display area and extending to the non-display area. A first conductive layer may be on the insulating layer of the non-display area and may contact a portion of an upper surface of the power supply line. A second conductive layer may contact an upper surface of the first conductive layer in the non-display area. The first conductive layer and the second conductive layer have an opening in a position corresponding to the opening of the power supply line and the fourth area of the driver.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
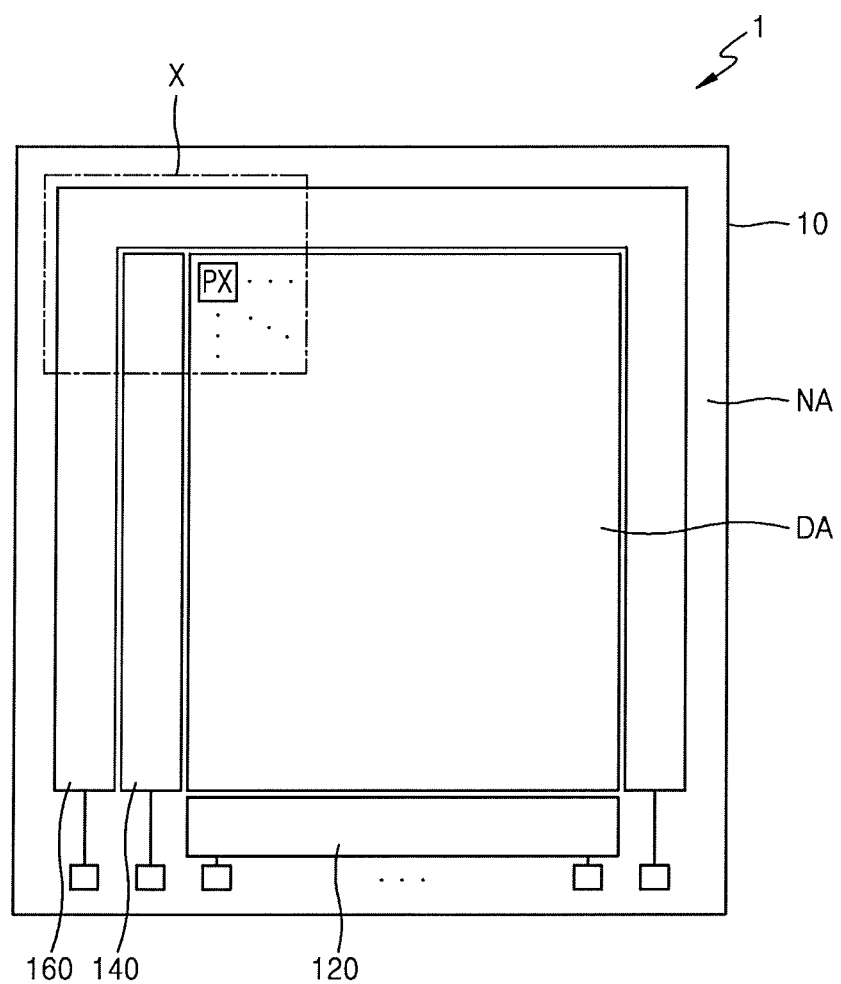
FIG. 1 is a plan view of a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals in the specification and drawings may refer to like elements.

It will be understood that although the terms "first" and "second" may be used herein to describe various components, these components should not be limited by these terms.

It will be understood that when a layer, region, or component is referred to as being "formed on" another layer, region, or component, it may be directly or indirectly formed on the other layer, region, or component. For example, intervening layers, regions, or components may be present.

Sizes of components in the drawings may be exaggerated for clarity.

Figure 2:
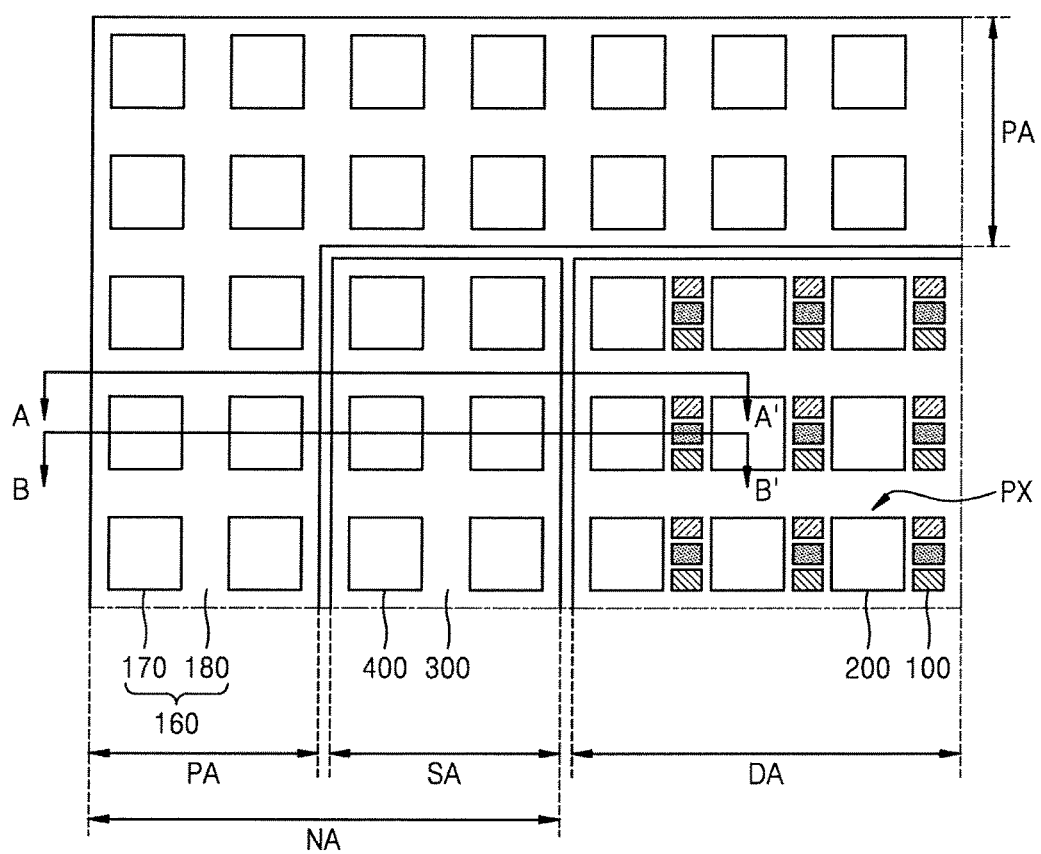
FIG. 2 is a plan view of an area X shown in FIG. 1.
Figure 3:
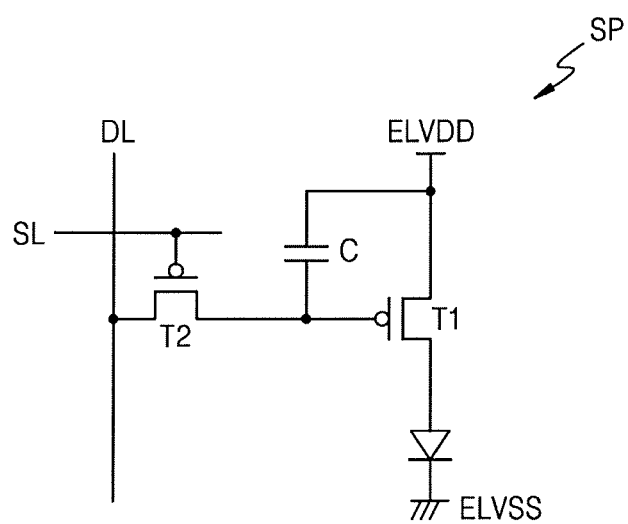
FIG. 3 is a circuit diagram of a pixel PX shown in FIG. 1.

FIG. 1 is a plan view of a display apparatus according to an exemplary embodiment of the present invention. FIG. 2 is a plan view of an area X shown in FIG. 1. FIG. 3 is a circuit diagram of a pixel PX shown in FIG. 1.

Referring to FIGS. 1 and 2, a substrate 10 of a display apparatus 1 may include a display area DA and a non-display area NA surrounding the display area DA. The display apparatus 1 may be an organic light-emitting display apparatus.

In the display area DA, a plurality of pixels PX may be arranged in a matrix of rows and columns. Each of the pixels PX may include a first area 100 and a second area 200. An image may be displayed in the first area 100 through which light is emitted, and external light may be transmitted through the second area 200. The external light may be transmitted through the substrate 10 and the second area 200 of each of the pixels PX. The second area 200 may serve as a transmission window of the display area DA. In this case, the pixels PX are arranged where the first area 100 and the second area 200 are alternately and repeatedly disposed along one direction. Thus, in the display area DA, the first area 100 and the second area 200 may be disposed at regular intervals along the one direction. Referring to FIG. 2, the first area 100 and the second area 200 may be alternately and repeatedly disposed along a row direction.

Each of the pixels PX may include a plurality of sub-pixels SP. Each of the sub-pixels SP may include a light-emitting device and a pixel circuit applying a current to the light-emitting device.

Referring to FIG. 3, the light-emitting device may be an organic light-emitting display device (OLED) including a first electrode, a second electrode, and an emission layer disposed between the first electrode and the second electrode. A second power supply voltage ELVSS may be applied to the second electrode of the OLED.

The pixel circuit may include two transistors, e.g., first and second transistors T1 and T2, and one capacitor C. A first power supply voltage ELVDD may be applied to a first electrode of the first transistor T1, and a second electrode of the first transistor T1 may be connected to the first electrode of the OLED. A gate electrode of the first transistor T1 may be connected to a second electrode of the second transistor T2. A gate electrode of the second transistor T2 may be connected to a scan line SL, and a first electrode of the second transistor T2 may be connected to a data line DL. A first electrode of the capacitor C may be connected to the gate electrode of the first transistor T1, and the first power supply voltage ELVDD may be applied to a second electrode of the capacitor C. The second power supply voltage ELVSS may be a voltage that is lower than the first power supply voltage ELVDD.

Referring to FIG. 3, although one sub-pixel SP includes two transistors and one capacitor, exemplary embodiments of the present invention are not limited thereto. For example, one sub-pixel SP may include two or more transistors and one or more capacitors, and may have any one of various structures in which a wiring line is formed or an existing wiring is omitted.

The non-display area NA may include a driving area SA in which a driver may be disposed and a wiring area PA in which a power line and a plurality of signal lines may be disposed. The driver may include a first driver 120 and a second driver 140. The power line of the wiring area PA may include a first power supply line supplying a first power supply voltage and/or a second power supply line supplying a second power supply voltage. Hereafter, a power supply line 160 for supplying the second power supply voltage is described as an example, and descriptions of the power supply line 160 may be similarly applied to the first power supply line disposed in the wiring area PA and other signal lines. A voltage and/or a signal may be applied to the first driver 120, the second driver 140, and the power supply line 160 through a pad.

The first driver 120 may generate data signals and may transmit the generated data signals to a plurality of data lines disposed in the display area DA. The first driver 120 may be a driving circuit, such as a shift register, a level shifter, a video line, and a switch, and may be an integrated circuit chip disposed on the substrate 10.

The second driver 140 may generate a scan signal and may transmit the scan signal to a plurality of scan lines disposed in the display area DA. The second driver 140 may generate a light-emitting control signal and may supply the light-emitting control signal to a plurality of light-emitting control lines disposed in the display area DA. The second driver 140 may be a driving circuit including a shift register and a level shifter which may include a plurality of transistors and a plurality of capacitors. The second driver 140 may be disposed on the substrate 10 along with the pixels PX of the display area DA. The second driver 140 of the non-display area NA and the pixels PX of the display area DA may be formed on the substrate 10 simultaneously.

Referring to FIG. 1, although the second driver 140 may generate a scan signal and a light-emitting control signal, exemplary embodiments of the present invention are not limited thereto. For example, a light-emitting control driver may be disposed on the right side of the display area DA, may generate a light-emitting control signal, and may transmit the generated light-emitting control signal to a light-emitting control line disposed in the display area DA.

The second driver 140 may include a third area 300 and a fourth area 400. A driving circuit, which may generate a scan signal and/or a light-emitting control signal, and which may include a plurality of signal lines may be disposed in the third area 300. According to an exemplary embodiment of the present invention, a driving circuit and/or signal lines may be disposed in portions of the third area 300 which may be at the left and right sides of the fourth area 400. The fourth area 400 may be a transmission area through which external light is transmitted, and driving circuit and/or signal lines might not be disposed in the fourth area 400. The fourth area 400 may serve as a transmission window of the driving area SA.

The power supply line 160 may be electrically connected to the second electrode of the OLED, may receive the second power supply voltage ELVSS through a pad, and may supply the second power supply voltage ELVSS to the pixels PX through the second electrode. The power supply line 160 may be disposed on at least one side of four sides forming the circumference of the substrate 10. In an exemplary embodiment of the present invention, the power supply line 160 may be disposed on remaining three sides other than one side in which the first driver 120 is disposed, and thus may have a "⊏" shape.

The power supply line 160 may include a plurality of openings 170. The plurality of openings 170 may be spaced apart from one another at regular intervals. Each of the openings 170 may be a transmission area through which external light is transmitted. An area 180 around the openings 170 may be a non-transmission area through which external light is not transmitted. The openings 170 may serve as transmission windows of the wiring area PA.

The substrate 10 may be sealed by a sealing member. The sealing member may be a sealing substrate that is combined with the substrate 10 via a sealing material, or an encapsulation thin film having a structure in which an inorganic material layer and an organic material layer are alternately formed on the substrate 10. However, exemplary embodiments of the present invention are not limited thereto, and any of various transparent thin film-type sealing structures may be used as the sealing member.

Figure 4:
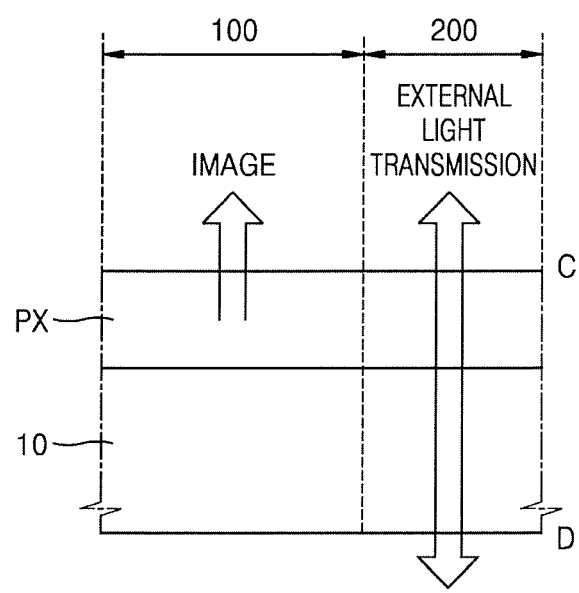
FIGS. 4 and 5 are plan views and FIG. 6 is a cross-sectional view illustrating a configuration of a pixel according to an exemplary embodiment of the present invention.
Figure 5:
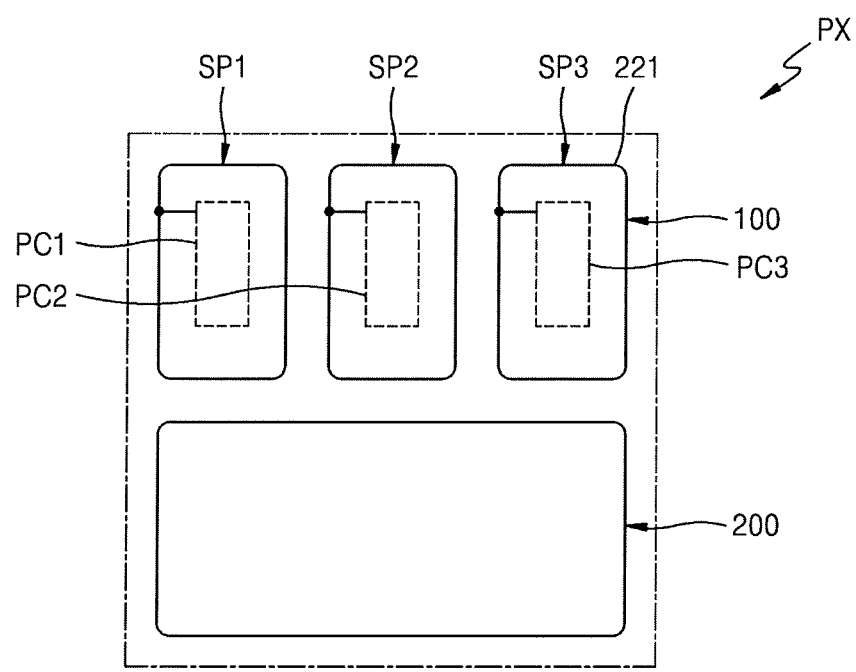
Figure 6:
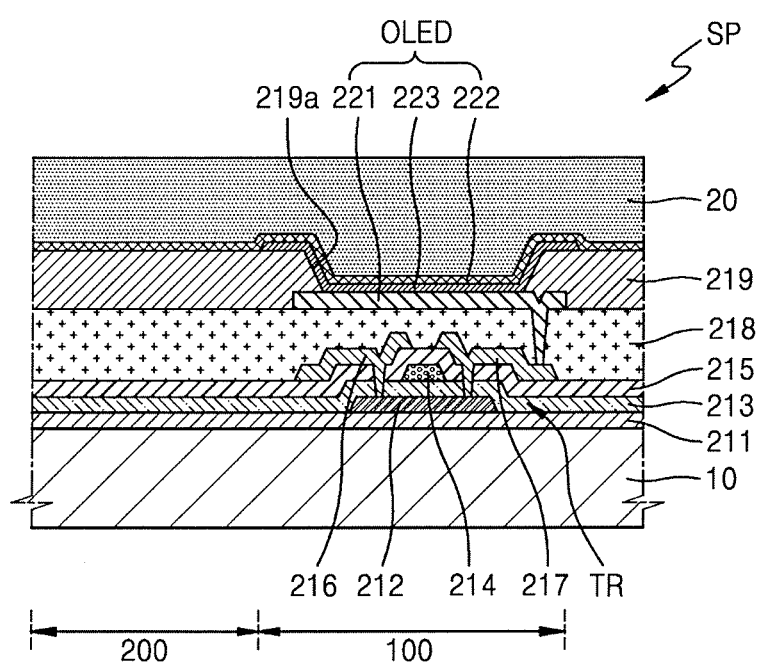

FIGS. 4 and 5 are plan views and FIG. 6 is a cross-sectional view illustrating a configuration of a pixel PX according to an exemplary embodiment of the present invention.

Referring to FIG. 4, the pixel PX may include the first area 100 through which light may be emitted and the second area 200 that is adjacent to the first area 100 at a side of the first area 100 and through which external light may be transmitted. A user may observe an image, which is displayed along a C direction through the first area 100, and may observe an image, which is displayed along a D direction through the second area 200. The display apparatus according to an exemplary embodiment of the present invention may be a transparent display apparatus of a top emission type.

Referring to FIG. 5, the pixel PX may include a plurality of sub-pixels SP, for example, a first sub-pixel SP1, a second sub-pixel SP2, and a third sub-pixel SP3. The first sub-pixel SP1, the second sub-pixel SP2, and the third sub-pixel SP3 may each emit light having a different color from each other. The first sub-pixel SP1, the second sub-pixel SP2, and the third sub-pixel SP may respectively emit red light, green light, and blue light. However, exemplary embodiments of the present invention are not limited thereto, and any other combinations than the combination of red, green, and blue light may be made. White light may be formed through the combination of the colored light emitted by the first sub-pixel SP1, the second sub-pixel SP2, and the third sub-pixel SP3.

The first sub-pixel SP1, the second sub-pixel SP2, and the third sub-pixel SP3 may be respectively driven by a first pixel circuit PC1, a second pixel circuit PC2, and a third pixel circuit PC3. The first pixel circuit PC1, the second pixel circuit PC2, and the third pixel circuit PC3 may be disposed so that at least a part of each of the first pixel circuit PC1, the second pixel circuit PC2, and the third pixel circuit unit PC3 overlap a first electrode 221 included in each of the first sub-pixel SP1, the second sub-pixel SP2, and the third sub-pixel SP3.

Referring to FIG. 6, the sub-pixel SP may include a transistor TR (e.g., the transistor T1). The transistor TR may include an active layer 212 disposed on a buffer layer 211, which may be disposed on a substrate 10. The transistor TR may include a gate electrode 214, and source and drain electrodes 216 and 217 electrically connected to the active layer 212. A first insulating layer 213 may be disposed between the active layer 212 and the gate electrode 214, and a second insulating layer 215 may be disposed between the gate electrode 214 and the source and drain electrodes 216 and 217. A third insulating layer 218 may be disposed on the source and drain electrodes 216 and 217.

The sub-pixel SP may include an OLED including the first electrode 221 electrically connected to one of the source and drain electrodes 216 and 217 of the transistor TR and disposed on the third insulating layer 218. The sub-pixel SP may include an intermediate layer 223 including an organic emission layer, and a second electrode 222. A fourth insulating layer 219, which may be a pixel-defining layer, may be disposed on an edge of the first electrode 221. The fourth insulating layer 219 may include an opening 219a exposing a portion of the first electrode 221 of the OLED. An upper surface of the second electrode 222 may be sealed by an encapsulation thin film 20.

Figure 7:
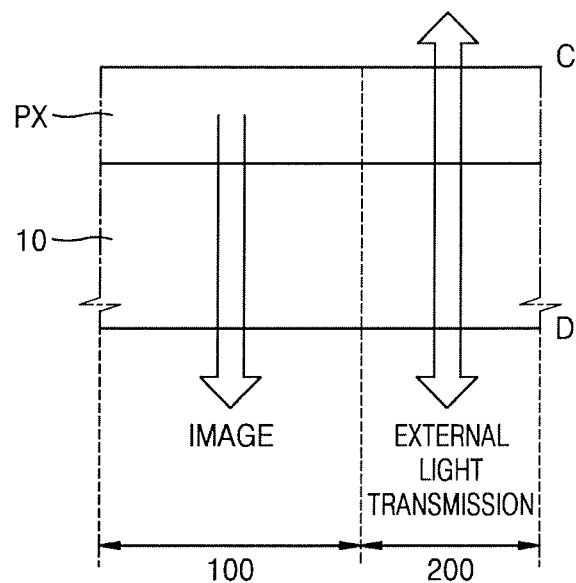
FIGS. 7 and 8 are plan views and FIG. 9 is a cross-sectional view illustrating a configuration of a pixel according to another exemplary embodiment of the present invention.
Figure 8:
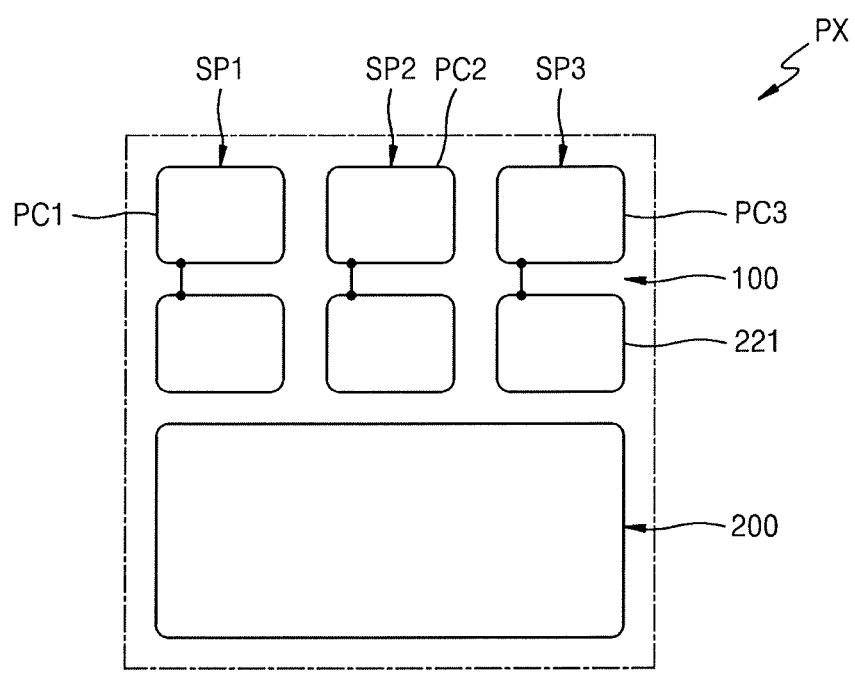
Figure 9:
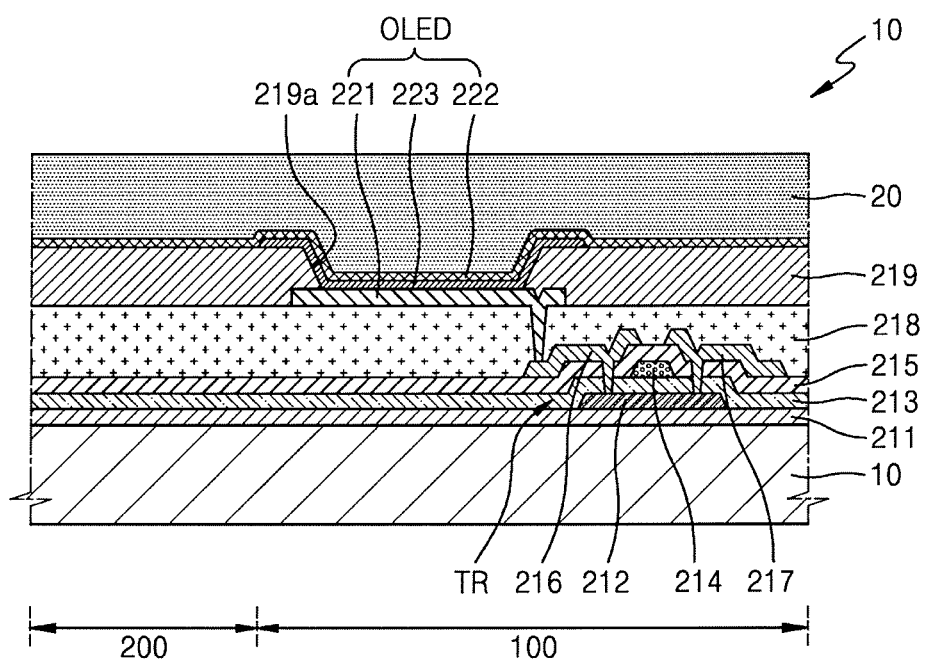

FIGS. 7 and 8 are plan views and FIG. 9 is a cross-sectional view illustrating a configuration of a pixel according to another exemplary embodiment of the present invention.

Referring to FIG. 7, the pixel PX may include the first area 100 through which light may be emitted and the second area 200 that is adjacent to the first area 100 at a side of the first area 100 and through which external light may be transmitted. An image may be displayed along the D direction, through the first area 100 and an image may be displayed along the C direction through the second area 200. The display apparatus according to an exemplary embodiment of the present invention may be a transparent display apparatus of a bottom light-emitting type.

Referring to FIGS. 8 and 9, the pixel PX may be different from the pixel PX described with reference to FIGS. 5 and 6 in that the first pixel circuit PC1, the second pixel circuit PC2, and the third pixel circuit PC3 each might not overlap the first electrode 221 included in each of a first sub-pixel SP1, a second sub-pixel SP2, and a third sub-pixel SP3. The configuration of the pixel PX of FIGS. 8 and 9 may be substantially the same as that of the pixel PX described with reference to FIGS. 5 and 6 except for this difference, and thus, duplicative descriptions may be omitted.

In the display apparatus according to an exemplary embodiment of the present invention, devices including an opaque material, for example, a transistor, a capacitor, and a light-emitting device, need not be disposed in the second area 200 of the pixel X. A transparent insulating layer may be disposed in the second area 200. Thus, external light transmittance in the second area 200 may be increased, and thus external light transmittance of the display apparatus according to an exemplary embodiment of the present invention may be increased and distortion of a transmission image may be reduced or prevented. For example, distortion of a transmission image due to interference by a transistor, a capacitor, or a light-emitting device may be reduced or eliminated.

Figure 10:
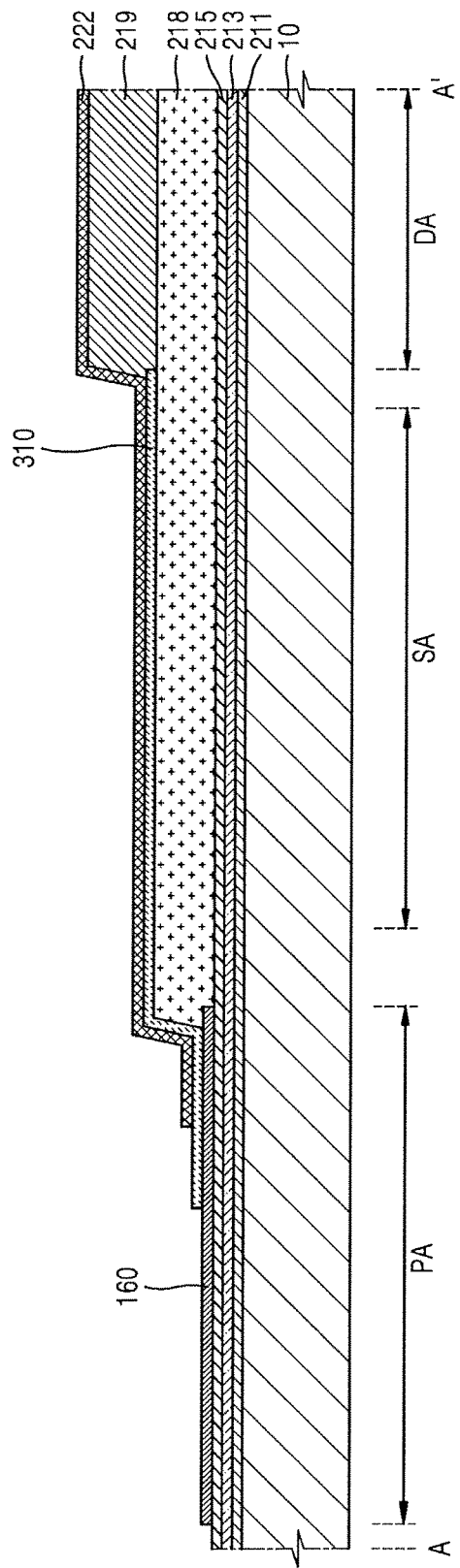
FIG. 10 is a cross-sectional view taken along a line A-A' of FIG. 2.
Figure 11:
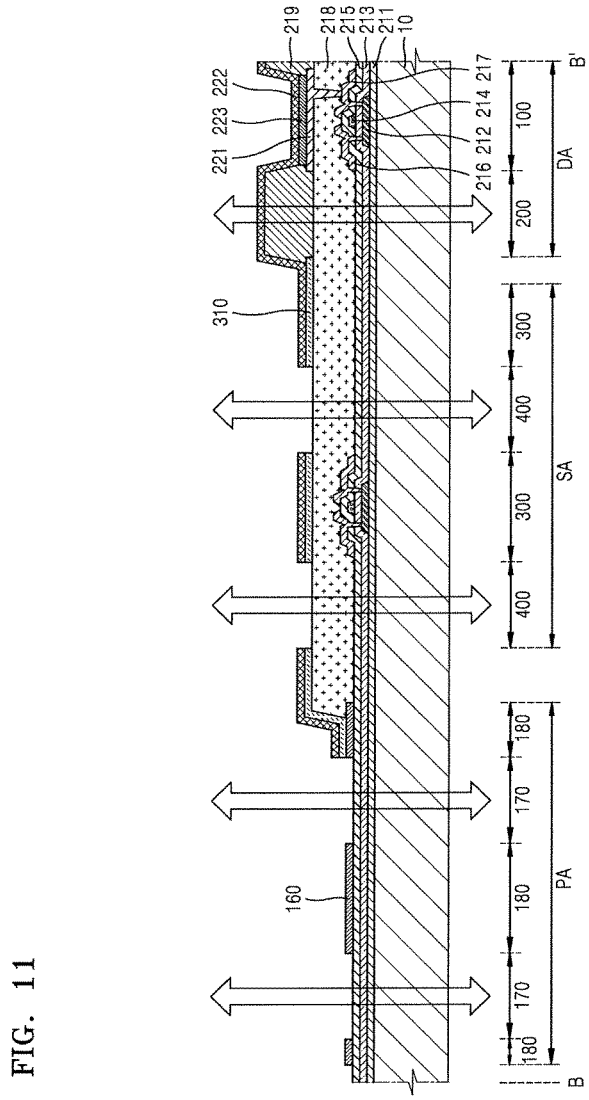
FIG. 11 is a cross-sectional view taken along a line B-B' of FIG. 2.

FIG. 10 is a cross-sectional view taken along a line A-A' of FIG. 2. FIG. 11 is a cross-sectional view taken along a line B-B' of FIG. 2.

Referring to FIGS. 10 and 11, the buffer layer 211 may be disposed on the substrate 10. The substrate 10 may include glass or plastic. The buffer layer 211 may reduce or eliminate a penetration of impurities into the substrate 10 and may planarize a surface of the substrate 10. The buffer layer 211 may have a single-layer structure or multi-layer structure including an inorganic material such as silicon nitride ($SiN_x$) and/or silicon oxide ($SiO_x$).

The pixel PX may be disposed on the buffer layer 211 of the display area DA. The second driver 140 and the power supply line 160 may be disposed on the buffer layer 211 of the non-display area NA.

The pixel PX may include the first area 100 and the second area 200. A pixel circuit including a transistor and a capacitor and a light-emitting device may be disposed in the first area 100. Referring to FIG. 11, at least a part of the pixel circuit may overlap the light-emitting device. The display apparatus according to an exemplary embodiment of the present invention may be a display apparatus of a top emission type, and the pixel circuits PC1, PC2, and PC3 including a transistor may be disposed between the substrate 10 and a first electrode 221. The first area 100 may be a light-emitting area in which an image is displayed, and the second area 200 may be a transmission area through which external light is transmitted.

The second driver 140 may include the third area 300 and the fourth area 400. A driving circuit and/or signal lines may be disposed in the third area 300. The driving circuit may include a plurality of transistors and a plurality of capacitors. The transistors and capacitors of the driving circuit may be formed substantially simultaneously with transistors and capacitors of a pixel circuit. The third area 300 may be a non-transmission area, and the fourth area 400 may be a transmission area through which external light is transmitted.

The power supply line 160 may include the opening 170. The area 180 around the opening 170 may be a non-transmission area, and the opening 170 may be a transmission area through which external light is transmitted.

A transistor of a pixel circuit will be described in more detail below. The transistor described below may be included in a driving circuit.

A transistor may include the active layer 212, the gate electrode 214 insulated from the active layer 212, and source and drain electrodes 216 and 217 electrically connected to the active layer 212.

The active layer 212 may include a semiconductor layer, and the semiconductor layer may include any of various materials. For example, the semiconductor layer may include an inorganic semiconductor material such as amorphous silicon or crystalline silicon. Alternatively, the semiconductor layer may include an oxide semiconductor or an organic semiconductor material.

The gate electrode 214 may have a single-layer structure or multi-layer structure including a first conductive layer including one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). Each of the source and drain electrodes 216 and 217 may have a single-layer structure or multi-layer structure including a second conductive layer including one or more materials selected from Al, Pt, Pd, Ag, Mg, Au, Ni, Nd, Ir, Cr, Li, Ca, Mo, Ti, W, and Cu.

The first insulating layer 213 may be disposed between the active layer 212 and the gate electrode 214. The second insulating layer 215 may be disposed between the gate electrode 214 and the source and drain electrodes 216 and 217. Each of the first and second insulating layers 213 and 215 may include an inorganic insulating layer. Each of the first and second insulating layers 213 and 215 may have a single-layer structure or multi-layer structure including one or more materials selected from $SiO_2$, $SiN_x$, SiON, $Al_2O_3$, $TiO_2$, $Ta_2O_5$, $HfO_2$, $ZrO_2$, BST, and PZT.

The third insulating layer 218 may be disposed on the source electrode 216 and the drain electrode 217. The third insulating layer 218 may cover a pixel circuit of the display area DA. The third insulating layer 218 may extend to the non-display area NA and may cover a portion of the non-display area NA. For example, the third insulating layer 218 may cover the second driver 140 in the driving area SA. The third insulating layer 218 may cover an edge of the power supply line 160, which may be adjacent to a side of the display area DA.

The third insulating layer 218 may have a single-layer structure or multi-layer structure including an organic layer. The third insulating layer 218 may include a general-purpose polymer (e.g., poly(methyl methacrylate) (PMMA) or polystyrene (PS)), a polymer derivative including a phenol group, an acrylic polymer, an imide-based polymer, an aryl ether-based polymer, an amide-based polymer, a fluorine-based polymer, a p-xylene-based polymer, a vinyl alcohol-based polymer, and/or a blend thereof. For example, the third insulating layer 218 may include polyimide, polyamide, and/or acrylic resin.

A light-emitting device may include the first electrode 221, the second electrode 222, and the intermediate layer 223 including an organic emission layer disposed between the first electrode 221 and the second electrode 222.

The first electrode 221 may be electrically connected to one of the source and drain electrodes 216 and 217. The first electrode 221 may be a reflective electrode. The first electrode 221 may be formed in each sub-pixel to have an isolated island shape by forming a third conductive layer on the third insulating layer 218 of the display area DA and patterning the third conductive layer for each sub-pixel. The third conductive layer may include Ag, Mg, Al, Pt, Pd, Au, Ni, Nd, Ir, Cr, or a combination thereof. In another exemplary embodiment of the present invention, the first electrode 221 may include a reflective layer including the third conductive layer, and a transparent or semi-transparent electrode layer formed on the reflective layer.

The edge of the first electrode 221 may be covered by the fourth insulating layer 219, which may be a pixel-defining layer. The fourth insulating layer 219 may have a single-layer structure or multi-layer structure including an organic insulating layer.

The second electrode 222 may be a transparent or semi-transparent electrode. The second electrode 222 may face the first electrode 221 of the display area DA. A fourth conductive layer may be disposed in the display area DA and a portion of the non-display area NA. The fourth conductive layer may function as the second electrode 222 in the display area DA, and may be disposed over all pixels included in the display area DA. For example, the second electrode 222 may be formed on substantially the entire surface of the display area DA. The fourth conductive layer may include one or more materials selected from Ag, Al, Mg, Li, Ca, Cu, LiF/Ca, LiF/Al, MgAg, and CaAg.

The intermediate layer 223 may be disposed between the first electrode 221 and the second electrode 222. The intermediate layer 223 may include an organic emission layer that emits light, and may include at least one selected from a hole injection layer (HIL), a hole transport layer (HTL), an electron transport layer (ETL), and an electron injection layer (EIL). However, exemplary embodiments of the present invention are not limited thereto, and various functional layers may be disposed between the first electrode 221 and the second electrode 222.

The organic emission layer may emit red light, green light, or blue light. However, exemplary embodiments of the present invention are not limited thereto. For example, the organic emission layer may emit white light. The organic emission layer may include a structure in which a light-emitting material that emits red light, a light-emitting material that emits green light, and a light-emitting material that emits blue light are stacked, or a structure in which a light-emitting material that emits red light, a light-emitting material that emits green light, and a light-emitting material that emits blue light are combined with one another. The red light, the green light, and the blue light are examples, and exemplary embodiments of the present invention are not limited thereto. A combination of various colors other than a combination of red, green, and blue may be used, and the organic emission layer may emit white light.

The power supply line 160 on the second insulating layer 215 disposed in the wiring area PA of the non-display area NA may include the same material as the source electrode 216 and the drain electrode 217. The power supply line 160 may include openings 170 formed at regular intervals. The power supply line 160 may be electrically connected to the second electrode 222 through a connection electrode 310.

The third conductive layer on the third insulating layer 218 of the non-display area NA may be insulated from the first electrode 221, and may form the connection electrode 310 that contacts a portion of an upper surface of the power supply line 160 of the wiring area PA. The connection electrode 310 may cover an upper surface of the third insulating layer 218 of the driving area SA. In another exemplary embodiment of the present invention, the connection electrode 310 may include a conductive layer that is different from the third conductive layer forming the first electrode 221.

The fourth conductive layer (e.g., the second electrode 222) extending to the non-display area NA may contact an upper surface of the connection electrode 310. The second electrode 222 may extend from the display area DA up to a portion of the wiring area PA across the driving area SA, and may directly contact the connection electrode 310. Thus, the second electrode 222 may be electrically connected to the power supply line 160.

The connection electrode 310 and the second electrode 222, disposed in the non-display area NA, may have an opening corresponding to a transmission area of the non-display area NA. For example, a portion of the connection electrode 310 and a portion of the second electrode 222, which are in an area corresponding to the fourth area 400 of the second driver 140 and/or an area corresponding to the opening 170 of the power supply line 160, may be removed by patterning. Thus, the fourth area 400 of the second driver 140 and an opening of the connection electrode 310 and the second electrode 222 which corresponds to the fourth area 400 may form a transmission area of the non-display area NA. A driving circuit of the second driver 140 and a plurality of signal lines may be disposed in the third area 300 of the second driver 140. A portion of the connection electrode 310 and a portion of the second electrode 222 may be disposed on the third insulating layer 218 in the third area 300. The opening 170 of the power supply line 160 and an opening of the connection electrode 310 and the second electrode 222 which corresponds to the opening 170 may form a transmission area of the non-display area NA.

The display apparatus according to an exemplary embodiment of the present invention may include a transmission area of the non-display area NA as well as a transmission area of the display area DA.

The transmission area of the display area DA may include the second area 200 of the pixel PX. The second area 200 of the display area DA may have a vertical structure in which the buffer layer 211, the first through fourth insulating layers 213, 215, 218, and 219, and the second electrode 222 are stacked. In another exemplary embodiment of the present invention, the fourth insulation layer 219 and the second electrode 222 of the second area 200 may be omitted. In this case, an external light transmission efficiency of the second area 200 may be increased.

A transmission area of the non-display area NA may include a transmission area of the driving area SA and a transmission area of the wiring area PA. The transmission area of the driving area SA may include the fourth area 400 of the second driver 140 and an opening of the connection electrode 310 and the second electrode 222 which corresponds to the fourth area 400. The transmission area of the wiring area PA may include the opening 170 of the power supply line 160 and an opening of the connection electrode 310 and the second electrode 222 which corresponds to the opening 170. The transmission area of the driving area SA may have a vertical structure in which the buffer layer 211 and the first through third insulating layers 213, 215, and 218 are stacked. The transmission area of the wiring area PA may have a vertical structure in which the buffer layer 211, the first insulating layer 213, and the second insulating layer 215 are stacked.

In the display apparatus according to an exemplary embodiment of the present invention, transmittances of transmission areas of the non-display area NA may be different from each other since stack structures of the transmission areas of the non-display area NA may be different from each other.

FIGS. 12 through 15 illustrate examples showing the adjustment of the transmittance of a display area and a non-display area, according to exemplary embodiments of the present invention.

The display apparatus according to an exemplary embodiment of the present invention may adjust the transmittance of the non-display area NA based on the transmittance of a display area DA. The transmittance of the display area DA may be determined by the size of the second area 200 and the transmittance of a stack structure of the second area 200.

The size of the transmission area of the non-display area NA may be adjusted so that the transmittance of the non-display area NA is substantially the same as or smaller than or larger than that of the display area DA. The transmissivity of a stack structure of each transmission area of the non-display area NA may increase or decrease the transmittance of the non-display area NA.

FIG. 2 illustrates an exemplary embodiment of the present invention in which the size of a transmission area TW2 (e.g., the fourth area 400 of the second driver 140 and/or the opening 170 of the power supply line 160) of the non-display area DA is substantially the same as that of a transmission area TW1 (e.g., the second area 200 of the pixel PX) of the display area DA.

Figure 12:
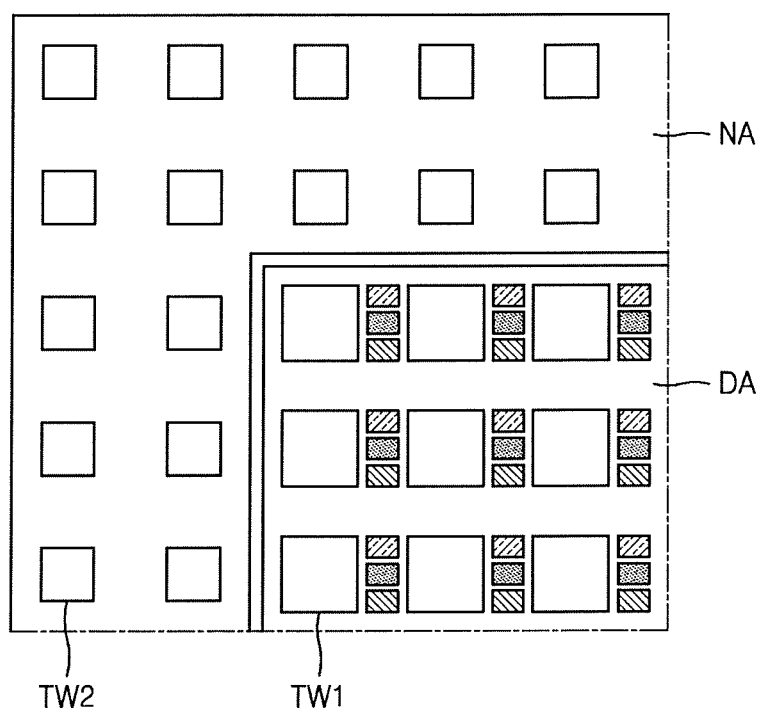
FIGS. 12 through 15 illustrate examples showing the adjustment of the transmittance of a display area and a non-display area, according to exemplary embodiments of the present invention.

FIG. 12 illustrates an exemplary embodiment of the present invention in which the size of the transmission area TW2 of the non-display area DA is smaller than that of the transmission area TW1 of the display area DA.

Figure 13:
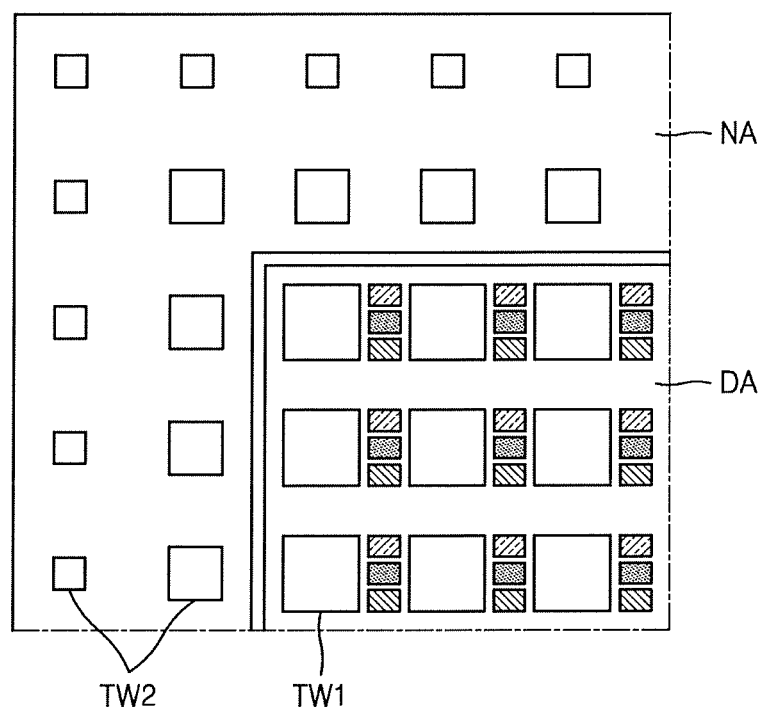

FIG. 13 illustrates an exemplary embodiment of the present invention in which the size of the transmission area TW2 of the non-display area DA gradually decreases toward the edge of a substrate with respect to the size of the transmission area TW1 of the display area DA.

Figure 14:
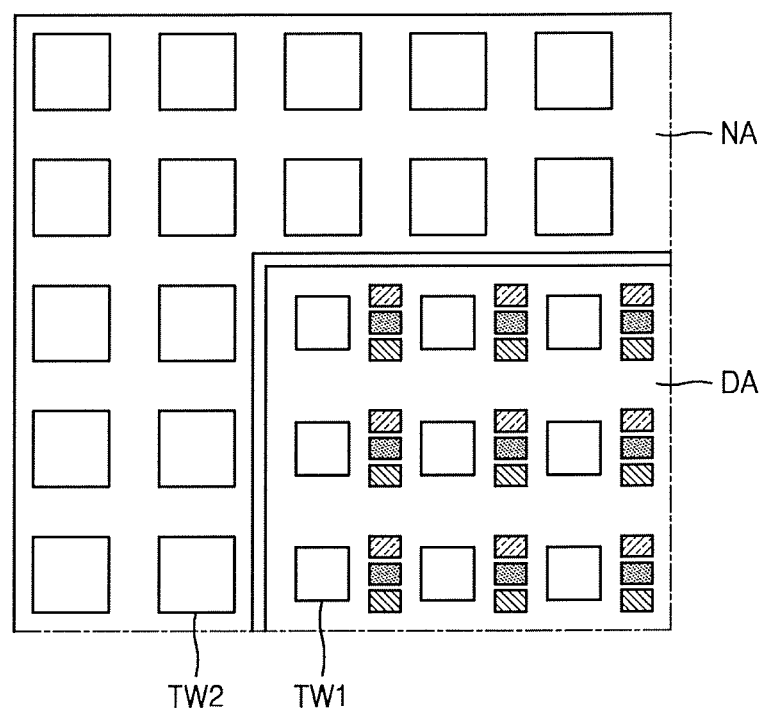

FIG. 14 illustrates an exemplary embodiment of the present invention in which the size of the transmission area TW1 of the display area DA is reduced and the size of the transmission area TW2 of the non-display area DA is larger than that of the transmission area TW1 of the display area DA.

Figure 15:
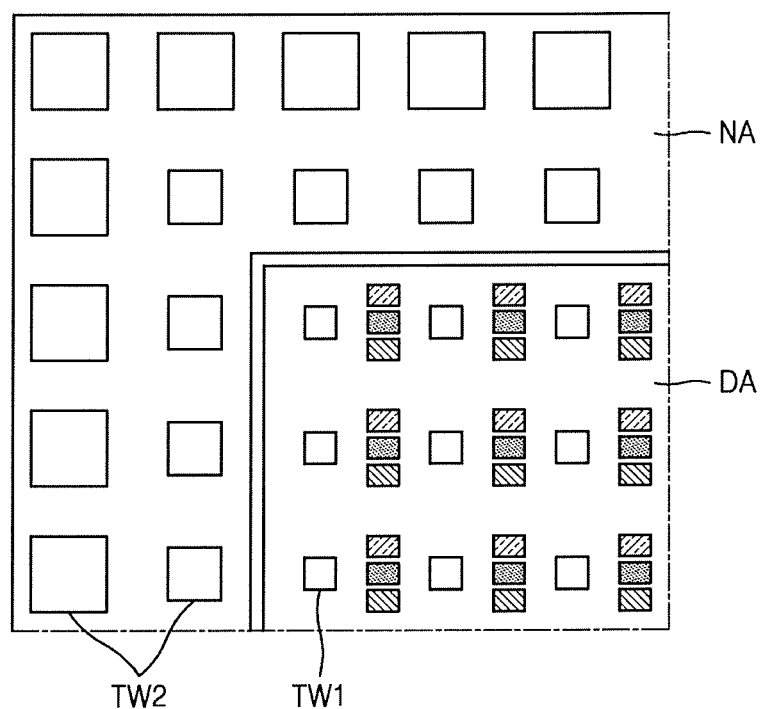

FIG. 15 illustrates an exemplary embodiment of the present invention in which the size of the transmission area TW1 of the display area DA is reduced and the size of the transmission area TW2 of the non-display area DA gradually increases toward the edge of a substrate based on the size of the transmission area TW1 of the display area DA.

In the exemplary embodiments of the present invention described herein, a border of the display apparatus may be transparent and may include a transparent area in a non-display area as well as a display area.

Although some exemplary embodiments of the present invention include a top gate-type TFT in which a gate electrode is on an active layer, exemplary embodiments of the present invention are not limited thereto. For example, a gate electrode may be disposed under an active layer.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus, comprising:
a display area and a non-display area around the display area;
a substrate comprising a plurality of pixels,
wherein each pixel comprises a first area from which light is emitted and a second area through which external light is transmitted,
wherein the plurality of pixels is arranged in a matrix in the display area, and
wherein the substrate comprises a transmission area, through which external light is transmitted, in the non-display area;
first and second conductive layers positioned in the non-display area, wherein the first and second conductive layers each include at least one opening overlapping the transmission area through which external light is transmitted when viewed in a plan view;
an encapsulation thin film sealing the substrate;
an insulating layer covering pixel circuits of the display area and extending to the non-display area;
the first conductive layer comprising a first electrode provided for each sub-pixel on the insulating layer of the display area and a connection electrode insulated from the first electrode on the insulating layer of the non-display area and contacting a portion of an upper surface of the power supply line; and
the second conductive layer facing the first electrode, wherein an emission layer is disposed between the first conductive layer and the second conductive layer in the display area, wherein the second conductive layer is in contact with an upper surface of the first conductive layer in the non-display area.

2. The display apparatus of claim 1, wherein a non-display area of the substrate comprises a power supply line having an opening in a position corresponding to the transmission area of the non-display area.

3. The display apparatus of claim 1, wherein a non-display area of the substrate comprises a driver comprising a third area in which a driving circuit supplying a signal to the pixels is disposed and a fourth area adjacent to the third area which corresponds to the transmission area.

4. The display apparatus of claim 1, wherein a size of the transmission area of the non-display area is substantially equal to that of the second area of each of the plurality of pixels.

5. The display apparatus of claim 1, wherein a size of the transmission area of the non-display area is different from that of the second area of each of the plurality of pixels.

6. The display apparatus of claim 1, wherein a size of the transmission area of the non-display area is smaller than that of the second area of each of the plurality of pixels, and wherein the size of the transmission area gradually decreases toward an edge of the substrate.

7. The display apparatus of claim 1, wherein a size of the transmission area of the non-display area is larger than that of the second area of each of the plurality of pixels, and wherein the size of the transmission area gradually increases toward an edge of the substrate.

8. A display apparatus comprising:
a substrate;
a plurality of pixels arranged in a matrix in a display area on the substrate, wherein each of the plurality of pixels comprises a first area from which light is emitted and a second area through which external light is transmitted;
a power supply line disposed in a non-display area around the display area, wherein the power supply line comprises an opening through which the external light is transmitted;
an insulating layer covering pixel circuits of the display area and extending to the non-display area;
a first conductive layer on the insulating layer of the non-display area and contacting a portion of an upper surface of the power supply line; and
a second conductive layer contacting an upper surface of the first conductive layer in the non-display area,
wherein the first conductive layer and the second conductive layer have an opening in a position corresponding to the opening of the power supply line.

9. The display apparatus of claim 8, wherein each of the plurality of pixels comprises a plurality of sub-pixels,
wherein a first area of each of the plurality of sub-pixels comprises:
a first electrode on the insulating layer of the display area;
a second electrode that faces the first electrode, wherein the second electrode comprises a portion of the second conductive layer in the display area; and
an emission layer between the first electrode and the second electrode.

10. The display apparatus of claim 9, wherein the first electrode comprises a same material as the first conductive layer.

11. The display apparatus of claim 8, wherein a size of the opening of the power supply line is substantially equal to that of the second area of each of the plurality of pixels.

12. The display apparatus of claim 8, wherein a size of the opening of the power supply line is different from that of the second area of each of the plurality of pixels.

13. The display apparatus of claim 8, wherein a size of the opening of the power supply line is smaller than that of the second area of each of the plurality of pixels, and wherein the size of the opening gradually decreases toward an edge of the substrate.

14. The display apparatus of claim 8, wherein a size of the opening of the power supply line is larger than that of the second area of each of the plurality of pixels, and wherein the size of the opening gradually increases toward an edge of the substrate.

15. The display apparatus of claim 8, wherein the non-display area further comprises a driver between the power supply line and the display area, and wherein the driver comprise a third area in which a driving circuit supplying a signal to the pixels is disposed and a fourth area adjacent to the third area through which the external light is transmitted.

16. The display apparatus of claim 15, further comprising:
an insulating layer covering pixel circuits of the display area and extending to the non-display area;
the first conductive layer on the insulating layer of the non-display area and contacting a portion of an upper surface of the power supply line; and
the second conductive layer contacting an upper surface of the first conductive layer in the non-display area.

17. A display apparatus, comprising:
a display area and a non-display area adjacent to the display area;
a substrate;
a pixel disposed on the substrate,
wherein the pixel comprises a first area configured to emit light and a second area configured to transmit external light;
an insulation layer positioned above the substrate in the display area and the non-display area;
a first conductive layer positioned above the insulation layer; and
a second conductive layer positioned above the first conductive layer,
wherein the non-display comprises a driving area and a wiring area,
wherein the first and second conductive layers include at least one first hole formed in the driving area, and wherein the first hole is configured to transmit external light, and
wherein the first and second conductive layers include at least one second hole formed in the wiring area, and wherein the second hole is configured to transmit external light.

* * * * *